(12) United States Patent
Kokubo

(10) Patent No.: US 7,056,624 B2
(45) Date of Patent: Jun. 6, 2006

(54) METHODS OF MANUFACTURING PHASE SHIFT MASKS HAVING ETCHED SUBSTRATE SHIFTERS WITH SIDEWALLS ROUNDED AT TOP AND BOTTOM CORNERS

(75) Inventor: Haruo Kokubo, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 26 days.

(21) Appl. No.: 10/399,203
(22) PCT Filed: Feb. 15, 2002
(86) PCT No.: PCT/JP02/01313

§ 371 (c)(1),
(2), (4) Date: Apr. 14, 2003

(87) PCT Pub. No.: WO02/065211

PCT Pub. Date: Aug. 22, 2002

(65) Prior Publication Data

US 2004/0023129 A1 Feb. 5, 2004

(30) Foreign Application Priority Data

Feb. 15, 2001 (JP) .............................. 2001-37998
Mar. 5, 2001 (JP) .............................. 2001-59516
Mar. 8, 2001 (JP) .............................. 2001-64198

(51) Int. Cl.
*G03F 1/08* (2006.01)
*G03F 7/18* (2006.01)
*C23F 1/04* (2006.01)
*C03C 15/00* (2006.01)

(52) U.S. Cl. ............................................ 430/5; 216/12
(58) Field of Classification Search .................. 430/5, 430/296, 320–324; 216/12

See application file for complete search history.

(56) References Cited

U.S. PATENT DOCUMENTS

| 5,397,665 A | * | 3/1995 | Tabuchi et al. ................. 430/5 |
| 5,965,301 A | * | 10/1999 | Nara et al. ....................... 430/5 |
| 6,251,549 B1 | * | 6/2001 | Levenson ....................... 430/11 |
| 6,340,542 B1 | * | 1/2002 | Inoue et al. ..................... 430/5 |

FOREIGN PATENT DOCUMENTS

| EP | 0650090 | | 4/1995 |
| EP | 650090 A1 | * | 4/1995 |
| JP | 56-133737 | | 10/1981 |
| JP | 05-303190 | | 11/1993 |

* cited by examiner

OTHER PUBLICATIONS

Levinson, Harry J., Principles of Lithography, 2001, SPIE—The International Society for Optical Engineering, p. 274.*

*Primary Examiner*—Mark F. Huff
*Assistant Examiner*—John Ruggles
(74) *Attorney, Agent, or Firm*—Ladas & Parry LLP

(57) ABSTRACT

Methods of manufacturing a single sided engraving phase shift mask that includes a shifter part and a non-shifter part mutually adjacent on a substrate, and a shading layer pattern formed with a shading film and wherein a side wall part of a dug-down part has round, crooked portions at top and bottom corners of the sidewall part. The method includes forming a resist pattern having a selective opening at the shifter part, forming a dug-down part corresponding to the shifter part by using the resist pattern, wet etching the whole surface at the dug-down part forming side of the substrate, forming a shading film on the substrate, forming a resist pattern on the shading film, and forming a shading pattern having prescribed openings at the shifter part and non-shifter part.

6 Claims, 8 Drawing Sheets

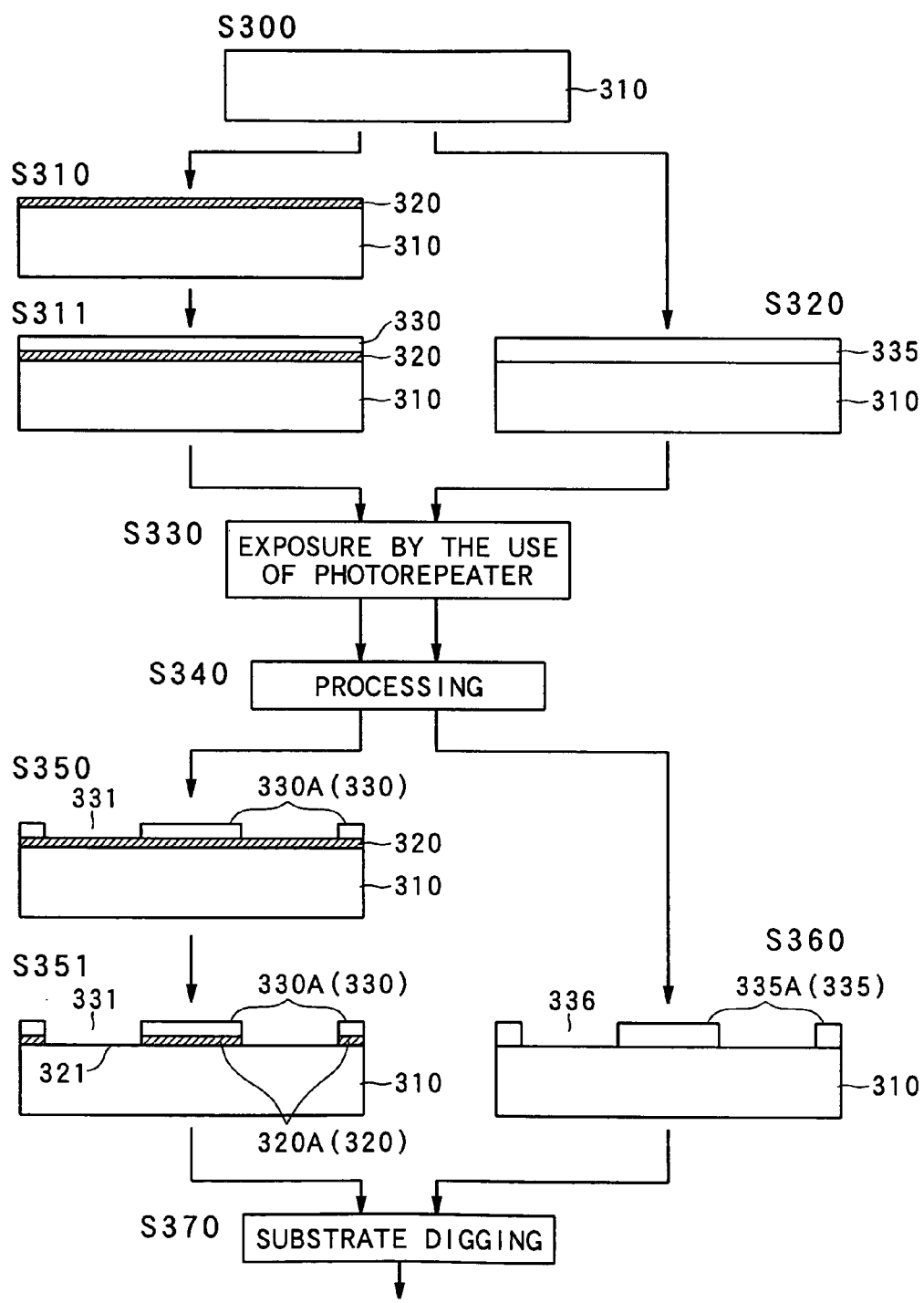

METHODS OF MANUFACTURING PHASE SHIFT MASKS HAVING ETCHED SUBSTRATE SHIFTERS WITH SIDEWALLS ROUNDED AT TOP AND BOTTOM CORNERS

BACKGROUND OF THE INVENTION

1. Field of the Invention

This invention relates to a photomask and its method of manufacture, in particular, this invention relates to a substrate engraving type phase shift mask and its method of manufacture.

2. Related Arts

The progress of optical lithography technology for forming a more detailed resist pattern on a wafer is remarkable. In such a field, the phase shift method has been adopted in which pattern resolution can be improved by mutually varying phases of light that penetrate two adjacent transparent portions on a mask.

This method carries out projection exposure on a wafer by using, a shifter for reversing the phase from one of the adjoining translucent parts, in which a mask is formed according to the relation d=ë/2 (n−1), wherein d is the film thickness, n is the refractive index, and ë is the exposure wavelength (hereinafter, the mask is called the "phase shift mask".) Since the light which passes through the shifter has a reverse phase (180 degrees) to the light transmitted through the adjoining translucent part, the optical intensity is set to 0 in the pattern boundary part, and the pattern can be separated, to improve resolution.

A mask shaped to realize the high resolution of the above-mentioned phase shifting method is described. There is a shifter formation type phase shift mask, as shown in FIG. 6A, which has a transparent medium (also called "a phase shift film" or "shifter") 530 at one of the two adjacent openings (translucent parts) 521 having a refractive index differing from air. In the case of this mask, however, it is difficult to deposit the phase shift film with sufficient accuracy because it has the same refractive index as the substrate, and because of multiplex reflections at the phase shift film 530.

Various substrate engraving type phase shift masks (they are also called "engraving type phase shift masks.") which dig the transparent substrate by etching, etc., which solve these problems are known. The substrate engraving type phase shift mask shown in FIG. 6C and FIG. 6D is in use especially now.

The engraving type phase shift mask shown in FIG. 6C is what is called a "single-side engraving type phase shift mask", which is manufactured, as shown in FIG. 6B, by dry-etching a substrate (Qz is generally used) partway to create a recess, and additionally, wet etching only the dug-down part (recess) so as to obtain the predetermined phase difference (usually 180 degrees). The engraving type phase shift mask shown in FIG. 6D is what is called a double side engraving type phase shift mask", which is manufactured, as shown in FIG. 6B, by dry-etching a substrate to obtain the predetermined phase difference (usually 180 degrees), and additionally, wet etching the whole surface.

In the substrate engraving type phase shift mask (having a predetermined phase difference (usually 180 degrees) by FIG. 6B, which is manufactured by subjecting the substrate to perpendicular dry etching simply, there is a problem that the degree of the penetration light intensity is varied by the existence of a substrate engraving in the opening. The substrate engraving type phase shift masks shown in FIG. 6C and FIG. 6D have been developed to solve this problem.

Generally, what is called the "substrate engraving type phase shift mask" refers to the phase shift mask containing the pattern from which the shading part, which shades exposure light, and the translucent part are formed on the transparent substrate having the transparent refractive index n to the exposure light of wavelength ë, and wherein mutually adjacent translucent parts are formed by digging down the transparent substrate at the translucent parts so as to satisfy the condition that d1−d2 is almost equal to ë/2 (n−1), wherein d1 is the depth of one recess at one side, and d2 is the depth of another recess adjacent to the former recess.

Hereinafter, the case where either one of d1 or d2 is 0 will be referred to as a "single-side engraving type phase shift mask", and the case where both d1 and d2 are 0 will be referred to as a "double-side engraving type phase shift mask".

Further, hereinafter, the recess having the larger recess depth (also called the "dug-down amount".) will be referred to as the "shifter part", and the other recess having the smaller recess depth will be the "non-shifter part".

The Levenson type phase shift mask can be mentioned as a substrate engraving type phase shift mask.

As the substrate engraving type phase shift mask, it is applicable to use a phase shift mask for KrF excimer lasers whose exposure light has a wavelength of 248 nm, a phase shift mask for ArF excimer lasers whose exposure light has a wavelength of 193 nm, and a phase shift mask for F2 excimer lasers whose exposure light has a wavelength of 157 nm.

However, when the structure of the engraving type phase shift mask as shown in FIG. 6C or FIG. 6D is adopted, the eaves 525 of shading film will be formed by wet etching, and it becomes easy to generate a chip and peeling of a shading film.

Particularly, after wet etching, the washing tolerance falls remarkably and it is impossible to perform the usual washing.

Moreover, when microstructuring of the circuit pattern progresses along with the improvement in the speed and high-densification of a semiconductor integrated circuit, peeling of the shading film occurs during wet etching in this structure, and it can be expected that manufacturing becomes difficult. Recently, in order to solve the problem on this structure, in the substrate engraving type phase shift mask on which the part to be etched (shifter part) and the part not to be etched (non-shifter part) adjoin mutually, it is proposed that there be a substrate engraving type phase shift mask, as shown in FIG. 7, having a structure where the shading film continuously covers from the end of the shifter part to the adjacent end of the non-shifter part, and the side wall 716 of the dug-down part intersects almost perpendicularly in the direction of the substrate.

The mask of the structure shown in FIG. 7, has no eaves of a shading film, so neither a chip nor peeling occurs, but a mask that has excellent durability can be produced.

However, if the substrate engraving type phase shift mask having the structure as shown in FIG. 7 is produced, it is also necessary to form a uniform shading film in the step-difference parts of a substrate.

If the shading film is formed unevenly, influence will arise for the processing accuracy at the time of plate-making, or various problems, such as a fall of washing tolerance, will occur in the thin portion of a shading film.

SUMMARY OF THE INVENTION

Thus, regarding the substrate engraving type phase shift mask with an etching part (shifter part) that is mutually adjacent to a non-etching part (non-shifter part), a phase shift mask is desired where the shading film is formed as shown in FIG. 7 so as to cover from the end of the shifter part to the adjacent end of the non-shifter part, and can also form a uniform shading film in the step-difference parts of a substrate.

This invention, therefore, corresponds to these needs and is for a phase shift mask, being of the single-side engraving type on which the etching part (shifter part) and the non-etching part (non-shifter part) are mutually adjacent, and where the shading film pattern is formed with a shading film which covers continuously from the end of the shifter part to the adjacent end of the non-shifter part including the side wall part of the dug-down part for forming the shifter part, and which can even form the uniform shading film in the step-difference parts of a substrate. A method for manufacturing the phase shift mask in this first invention is also provided.

The phase shift mask according to the first invention which solves the above-mentioned problems is a single side engraving type phase shift mask which comprises a shifter part and a non-shifter part mutually adjacent on a substrate, and which has a shading layer pattern formed with a shading film which continuously covers from the end of the shifter part to the adjacent end of the non-shifter part including the side wall part of the dug-down part for forming the shifter part (also called "recess"), and wherein the side wall part inclines so that the above-mentioned side wall part may spread toward the substrate surface.

The method for manufacturing a phase shift mask according to the first invention is a method for manufacturing a single sided engraving type phase shift mask which comprises a shifter part and a non-shifter part mutually adjacent on a substrate, and which has a shading layer pattern formed with a shading film which continuously covers from the end of the shifter part to the adjacent end of the non-shifter part including the side wall part of the dug-down part for forming the shifter part (recess), and wherein the side wall part inclines so that the above-mentioned side wall part may spread toward the substrate surface, which method comprises the following steps in this order; (a) a step in which a resist pattern is formed by directly opening the shifter part to the substrate, (b) a dry etching step for forming a shifter part by using the resist pattern as an etching-proof mask, and (c) a shading layer pattern formation step by photo etching after the formation of shading film on the whole surface of the substrate, wherein the resist pattern shows a film decreasing so that the width of the opening may be expanded by dry etching, and wherein the dry etching process is carried out while expanding the opening width of the resist pattern to incline the side wall part of the dug-down part so as to spread toward the substrate surface.

Further, in the resist pattern formation step, the resist pattern is formed, after applying resist directly on a substrate, by exposure drawing with photograph drawing equipment, and further subjecting it to the development treatment.

By such a constitution, the phase shift mask according to the first invention is enabled to provide the single-side engraving type phase shift mask, on which the shifter part and the non-shifter part are mutually adjacent on a substrate, and where the shading film pattern is formed with a shading film which continuously covers from the end of the shifter part to the adjacent end of the non-shifter part including the side wall part of the dug-down part for forming the shifter part, and can also form the uniform shading film in the step-difference parts of a substrate.

That is, the film formation for a shading film does not become uneven as in the case of the conventional structure of FIG. 7, since the side wall part of the shifter part is inclined so that it spreads toward the substrate surface, which can form a uniform shading film. Further, the method of manufacturing the phase shift mask according to the first invention, by taking the above constitution, provides a method for manufacturing the single-side engraving type phase shift mask, on which the shifter part and the non-shifter part are mutually adjacent on a substrate, and where the shading film pattern is formed with a shading film which continuously covers from the end of the shifter part to the adjacent end of the non-shifter part including the side wall part of the dug-down part for forming the shifter part, and can also form the uniform shading film in the step-difference parts of a substrate.

Concretely, it is attained by performing in this order (a) a resist pattern forming step to form a pattern by directly opening the shifter part to the substrate, (b) a dry etching step for forming a shifter part by using the resist pattern as an etching-proof mask, and (c) a shading layer pattern formation step by photoetching after the formation of shading film on the whole surface of the substrate; wherein the resist pattern shows a film decreasing so that the width of the opening may be expanded by dry etching, and wherein the dry etching process is carried out while expanding the width of the opening of the resist pattern to incline the side wall part of the dug-down part so as to spread toward the substrate surface.

That is, it can be made to incline the side wall part of the shifter part to spread toward the substrate surface, since the resist is applied directly on the substrate and then a desired pattern is formed by exposing and developing in order to etch the substrate directly, where the opening of the resist pattern is gradually enlarged along with the progress of the etching of substrate.

By inclining the side wall part of the shifter part so that it spreads toward the substrate surface, when a shading layer is formed on the whole surface, the shading film shall be formed uniformly.

Moreover, since the shifter part is formed by dry etching, the short-cut of the process and cost reduction can be attained by using the above-mentioned resist pattern as an etching-proof mask after the process for forming the resist pattern by opening the shifter part directly on the substrate.

Additionally, since the shading pattern made of chromium etc. was used as an etching-proof mask on the occasion of production of the conventional substrate engraving type phase shift masks of FIG. 6C and FIG. 6D, the process was complicated, and time-consuming.

Next, the method for manufacturing the phase shift mask according to the second invention which solves the above-mentioned problems is a method for manufacturing a single-side engraving type phase shift mask which comprises a shifter part and a non-shifter part mutually adjacent on a substrate, and which has a shading layer pattern formed with a shading film which continuously covers from the end of the shifter part to the adjacent end of the non-shifter part including the side wall part of the dug-down part for forming the shifter part. This method comprises the following steps in this order;

(a) A metal film pattern forming step for forming a metal film pattern made of metal by opening a dug-down forming region for forming a shifter part onto one side of a substrate, wherein the substrate is transparent to the exposure light to be used and has flat faces in both sides, (b) a dry etching step for forming the dug-down part (recess) which has a depth d0 satisfying the condition that d0 is almost equal to ë/2 (n−1), wherein ë is the wavelength of exposure light to be used, and n is the refractive index of the substrate, by digging down the substrate with the dry etching force, (c) a wet etching step for etching the whole surface at the dug-down part forming side of the substrate, after removing the metal film off, and (d) a shading layer pattern formation step for forming the shading layer pattern which has openings for exposing the shifter part and the non-shifter part, by photoetching a shading film, formed in advance, wherein the shading film is formed on the dug-down part forming side of the substrate while continuously covering the whole surface of the side including the side wall of the dug-down part (recess) for forming the shifter part.

In the above method, the wet etching process may be characterized by being that for a 10 nm–100 nm etching.

In the above method, the wet etching process may be carried out by using hydrofluoric acid.

Alternatively, in the above method, the wet etching process may also be carried out by using a heated alkali.

The phase shift mask according to this invention is a single sided engraving type phase shift mask which comprises a shifter part and a non-shifter part mutually adjacent on a substrate, and which has a shading layer pattern formed with a shading film which continuously covers from the end of the shifter part to the adjacent end of the non-shifter part including the side wall of the dug-down part for forming the shifter part (recess), and characterized by the fact that it is manufactured by the above mentioned method for manufacturing the phase shift mask of this invention.

Regarding this invention, what is called a "substrate engraving type phase shift mask" is directed to the phase shift mask which has the pattern on which the shading part, which shades exposure light, and the translucent parts are formed on the transparent substrate having the transparent refractive index n to the exposure light of wavelength ë, and wherein mutually adjacent translucent parts are formed by digging down the transparent substrate at the translucent parts so as to satisfy the condition that d1−d2 is almost equal to ë/2 (n−1), wherein d1 is the depth of one recess, d2 is the depth of another recess adjacent to the former recess, and particularly, the case where one of d1 or d2 is 0 is called a "single-side engraving type phase shift mask".

Further, regarding this invention, the recess having the larger recess depth (also called the "dug-down amount".) is called the "shifter part", and the other recess having the smaller recess depth is called the "non-shifter part".

The Levenson type phase shift mask can be mentioned as a single-side engraving type phase shift mask according to this invention.

The single-side engraving type phase shift mask according to this invention can be used for the phase shift mask for KrF excimer lasers, whose exposure light has a wavelength of 248 nm, the phase shift mask for ArF excimer lasers, whose exposure light has a wavelength of 193 nm, and the phase shift mask for F2 excimer lasers, whose exposure light has a wavelength of 157 nm.

By such a constitution, the method for manufacturing the phase shift mask according to the present invention is enabled to provide the method for manufacturing a single-side engraving type phase shift mask, on which the shifter part and the non-shifter part are mutually adjacent on a substrate, and where the shading film pattern is formed with a shading film which continuously covers from the end of the shifter part to the adjacent end of the non-shifter part including the side wall part of the dug-down part for forming the shifter part, and can also form the uniform shading film in the step-difference parts of a substrate.

By carrying out the wet etching step, which follows the dry etching step, and where the metal film is removed from the whole area and then the whole surface at the dug-down part forming side of the substrate is etched, to form a uniform shading layer even in the step-difference part of a substrate at the next step of forming the shading layer all over the surface of the substrate can be realized.

Thereby, unlike the conventional structure of FIG. 7, the phase shift mask can be manufactured without the uneven formation of the shading film.

As an applicable substrate engraving type phase shift mask, the Levenson type phase shift mask can be mentioned, and it is particularly effective when the wet etching process-gives an etching of 10 nm–100 nm.

When the one-side engraving type phase shift mask is a phase shift mask for KrF excimer lasers whose exposure light has a wavelength of 248 nm, the second invention is effective. When a substrate engraving type phase shift mask is for ArF excimer lasers whose exposure light has a wavelength of 193 nm, or that for F2 excimer lasers whose exposure light has a wavelength of 157 nm, the second invention is also effective.

The type of phase shift mask described by the second invention enables the creation of a single-side engraving type phase shift mask, on which the shifter part and the non-shifter part are mutually adjacent on a substrate, and where the shading film pattern is formed with a shading film which covers continuously from the end of the shifter part to the adjacent end of the non-shifter part including the side wall part of the dug-down part for forming the shifter part, and can also form a uniform shading film in the step-difference parts (also called a "recess") of a substrate.

As described above, we, the inventors, offer the one-side engraving type phase shift mask according to described above by the above first and second inventions as a phase shift mask which can also form a uniform shading film in the step-difference part of a substrate.

General views of concrete embodiments of the shift mask according to these inventions are shown in FIGS. 1I and 2I.

The mask shown in FIG. 1I is one embodiment of the phase shift mask according to the first invention, and wherein the side wall 116 of the dug-down part inclines so that it spreads toward the substrate surface, and the mask shown in FIG. 2I is one embodiment of the phase shift mask according to the second invention, and wherein the top edge part 242 of the side wall of the dug-down part and the bottom edge part 243 of the side wall are formed in a round in shape, which can make the film formation of the shading film 150 (or 250) uniform.

In the production of the substrate engraving type phase shift mask of the structure shown in FIG. 7, or FIG. 1I or FIG. 2I, after making the first plate for the formation of the dug-down part and the engraving of the substrate, a shading film is formed, and then the making of the second plate for the shade film pattern formation is performed, whereas in the conventional substrate engraving type phase shift mask of the structure shown in FIG. 6C or FIG. 6D, the making of the plate for the shade film pattern formation is performed first and then shade film pattern is subsequently formed, and if necessary, this is followed by the making of the plate for the formation of dug-down part forming and the engraving of the substrate.

When producing the substrate engraving type phase shift mask of the structure shown in FIG. 7, FIG. 1I or FIG. 2I, the making of the first plate for the formation of the dug-down part and the making of the second plate for shading film pattern formation results in a prolonged process and therefore an increase in the efficiency of the process is called for.

Thus, an enhancement in the efficiency of process is called for in the one-side engraving type phase shift mask as shown in FIG. 7, FIG. 1I and FIG. 2I, which solves the problem of the eaves of the shading film pattern of the conventional engraving type phase shift mask as shown in FIG. 6C and FIG. 6D, and wherein the shifter part and non-shifter part are mutually adjacent.

Therefore, the third invention corresponds to these needs and aims to provide a method for manufacturing a phase shift mask capable of enhancing the efficiency of the process, the mask being a one-side engraving type phase shift mask, on which the shifter part and the non-shifter part are mutually adjacent on a substrate, and where the shading film pattern is formed with a shading film which covers continuously from the end of the shifter part to the adjacent end of the non-shifter part including the side wall part of the dug-down part for forming the shifter part, and can also form the shading film uniformly also in the step-difference parts of a substrate.

The method for manufacturing the phase shift mask according to the third invention which solves the above-mentioned problems is that for the manufacturing of a single side engraving type phase shift mask which comprises a shifter part and a non-shifter part mutually adjacent on a substrate, and which has a shading layer pattern formed with a shading film which has a shading property to exposure light and which covers continuously from the end of the shifter part to the adjacent end of the non-shifter part including the side wall part of the dug-down part for forming the shifter part (recess), and wherein to create the patterning of the dug-down part forming area for giving the shifter part, a photoresist is coated on one side of the substrate either directly or via a metal film, a dug-down part forming area for giving the shifter part in the formed photoresist is selectively exposed by using a photorepeater, and then the exposed photoresist is developed to obtain the resist pattern having an opening as the dug-down part forming area.

In the above method, the resist pattern forming step comprises coating a photoresist on one side of the substrate via a metal film, selectively exposing a dug-down part forming area for giving the shifter part in the formed photoresist by using a photorepeater, and then developing the exposed photoresist to obtain the resist pattern having an opening as the dug-down part forming area, wherein the metal film is tolerant at least to the etching gas to be used when digging the substrate down by dry etching. Thereafter, by using this resist pattern as an etching-proof mask, the metal film exposed from the opening is etched to form a metal film pattern, then the substrate part exposed from the opening of the formed metal film pattern is dry etched to form the dug-down part, the resist pattern is removed, a metal film pattern is exfoliated, and optionally, the whole part is subjected to wet etching, washing, etc., and then the shading film, which has a shading property to the exposure light to be used, is formed on the dug-down part forming side of the substrate, and the formed shading film is processed by the photoetching method to form the shading film pattern.

Alternatively, in the above method, the resist pattern forming step comprises coating a photoresist directly on one side of the substrate, selectively exposing a dug-down part forming area for giving the shifter part in the formed photoresist by using a photorepeater, and then developing the exposed photoresist to obtain the resist pattern having an opening as the dug-down part forming area. Thereafter, by using this resist pattern as an etching-proof mask, the substrate part exposed from the opening of the mask film pattern is etched to form the dug-down part, and then the shading film, which has a shading property to the exposure light to be used, is formed on the dug-down part forming side of the substrate, and the formed shading film is processed by the photoetching method to form the shading film pattern.

In the above method, the digging down of the substrate part is characterized by the fact that the depth d0 of the dug-down part (recess) is almost equal to ë/2 (n−1), wherein ë is the wavelength of exposure light and n is the refractive index of the substrate.

The photorepeater is an apparatus with which the pattern of the master mask is projected with a reduced scale onto a secondary mask through a lens system by using ultraviolet rays, such as i-ray (365 nm), or excimer lasers, such as KrF having an exposure light having a wavelength of 248 nm and wherein the pattern is exposed repeatedly at high-speed while the position of the secondary mask is moved frequently with a predetermined pitch. The term "photostepper" refers to when the pattern of a parent mask is exposed on a wafer.

The "shading property to exposure light" means that it is shading the exposure light at the time of exposure on a wafer using the produced phase shift mask.

The phase shift mask according to this invention is a single side engraving type phase shift mask which comprises a shifter part and a non-shifter part mutually adjacent on a substrate, and having a shading layer pattern formed with a shading film which has a shading property to the exposure light and which covers continuously from the end of the shifter part to the adjacent end of the non-shifter part including the side wall part of the dug-down part for forming the shifter part (recess), and characterized by the fact that it is manufactured by the above mentioned method for manufacturing the phase shift mask of this invention.

By such a constitution, the method for manufacturing the phase shift mask described by the invention enables the method for manufacturing a phase shift mask capable of enhancing the efficiency of the process. The mask is a single-side engraving type phase shift mask, on which the shifter part and the non-shifter part are mutually adjacent on a substrate, and where the shading film pattern is formed with a shading film that has a shading property to exposure light and which covers continuously from the end of the shifter part to the adjacent end of the non-shifter part including the side wall part of the dug-down part for forming the shifter part, and which can also form the uniform shading film in the step-difference parts of a substrate.

In more detail, to adapt the photorepeater to the making of the plate for the formation of the dug-down part forming area, it has been found in this invention that the accuracy of the making of the plate for the formation of a dug-down part forming area can be less accurate than that of the making of the second plate, for the formation of the shading film pattern. The previous statement is based on the fact that the substrate dug-down parts serve as a repetition pattern and with respect to the one-sided engraving type phase shift mask on which the shifter part and the non-shifter part are mutually adjacent on a substrate and where the shading film pattern is formed with a shading film which covers continuously from the end of the shifter part to the adjacent end of the non-shifter part including the side wall part of the dug-down part for forming the shifter part. Therefore, the efficiency of the process can be enhanced by applying the photorepeater to the making of the plate for the formation of the dug-down part forming area.

As described above, when using a photorepeater, it is possible to take repeated exposures of the pattern at an enhanced speed, as compared with the case using electron beam drawing exposure equipment or other photodrawing exposure equipment. Thus, once master masks that have various patterns are prepared in advance, it becomes possible to quickly take exposure for formation of the dug-down part forming area to objects of various sizes.

Especially when exposing the resist, which is applied directly on the substrate on which a shading film is not formed, it becomes unnecessary to consider the influence of an increased charge since the exposure is done by light.

Thus, it becomes possible to improve the throughput and cut costs by using a photorepeater.

As a substrate engraving type phase shift mask to which the manufacturing method of this invention can be applied, the Levenson type phase shift mask is mentioned. It is particularly effective when applied to the line and space pattern (also called the "L&S pattern".) on which the shifter parts of 1.0 μm or less and the non-shifter parts of 1.0 μm or less are arranged alternately in the shape of a lattice.

It is effective when the substrate engraving type phase shift mask to be applied is a phase shift mask for a KrF excimer laser whose exposure light is the wavelength of 248 nm. It is also effective when the mask is a phase shift mask for excimer lasers whose exposure light has a wavelength of 193 nm, or the phase shift mask for F2 excimer lasers whose exposure light has a wavelength of 157 nm.

The phase shift mask according to the invention enables a reduced-cost, single-side engraving type phase shift on which the shifter part and the non-shifter part are mutually adjacent on a substrate, and where the shading film pattern is formed with the second shading film which covers continuously from the end of the shifter part to the adjacent end of the non-shifter part including the side wall part of dug-down part (recess) for forming the shifter part.

Moreover, it is effective when the phase shift mask of this invention is a phase shift mask for KrF excimer lasers whose exposure light has a wavelength of 248 nm. It is even more effective when it is a phase shift mask for ArF excimer lasers whose exposure light has a wavelength of 193 nm. It is particularly effective when it is a phase shift mask for F2 excimer lasers whose exposure light has a wavelength of 157 nm.

BRIEF DESCRIPTION OF THE DRAWINGS

FIG. 1A–FIG. 1I are sectional views each showing a process step in one embodiment of the manufacture method of the first phase shift mask according to the invention, wherein FIG. 1I shows a partial sectional view of an embodiment of the phase shift mask according to this invention;

FIG. 2A–FIG. 2I are sectional views each showing a process step in the feature part of one embodiment of the method of manufacturing the second phase shift mask according to the invention, wherein FIG. 2I shows a sectional view of the feature part of one embodiment of the phase shift mask according to this invention;

FIG. 3 is an outline process flow chart for explaining the feature processes of two embodiments of the method of manufacturing the third phase shift mask of this invention;

BEST MODE FOR CARRYING OUT THE INVENTION

This invention will now be described in detail with reference to the annexed drawings. Each embodiment shown below is, however, indicated only for the purpose of providing an easy explanation of this invention and does not limit the spirit and the scope of this invention at all. This invention is limited only by the Claims annexed hereto.

1. Phase Shift Mask Having an Inclined Side Wall Part in the Dug-down Part

Figure 1A:
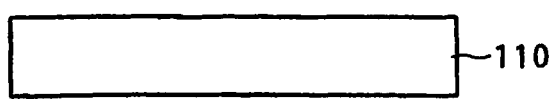
FIG. 1A–FIG. 1I are sectional views each showing a process step in one
Figure 1B:
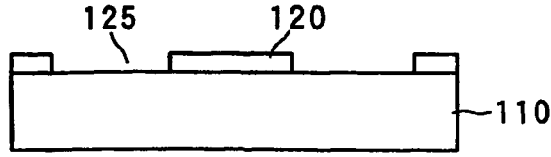
Figure 1C:
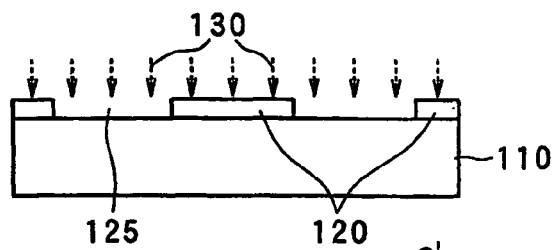
Figure 1D:
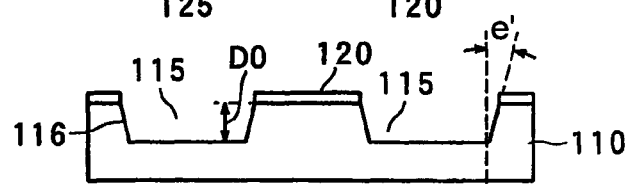
Figure 1E:
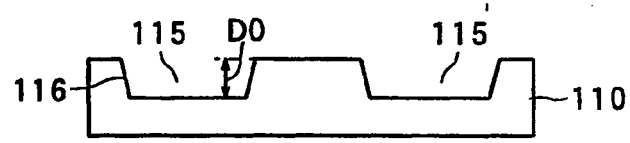
Figure 1F:
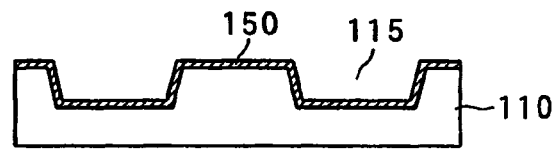
Figure 1G:
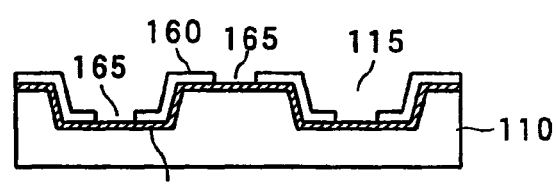
Figure 1H:
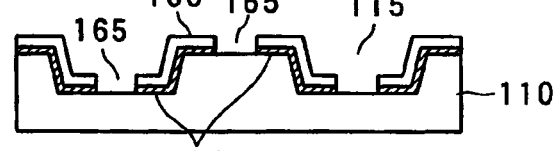
Figure 1I:
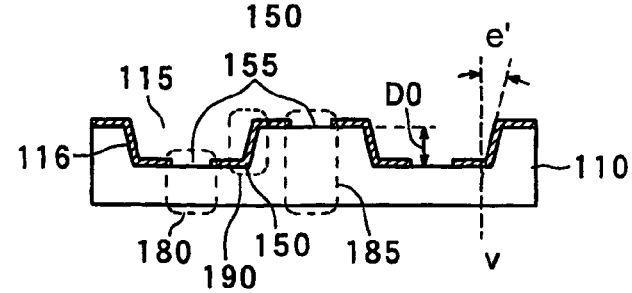
Figure 5A:
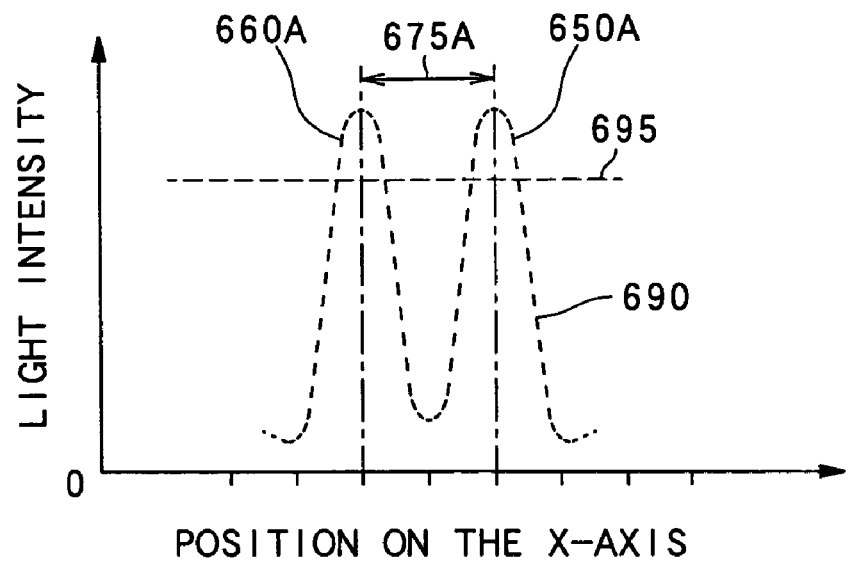
FIG. 5A is a chart which shows the distribution of the optical intensity at adjoining translucent parts (line parts) on the wafer.
Figure 5B:
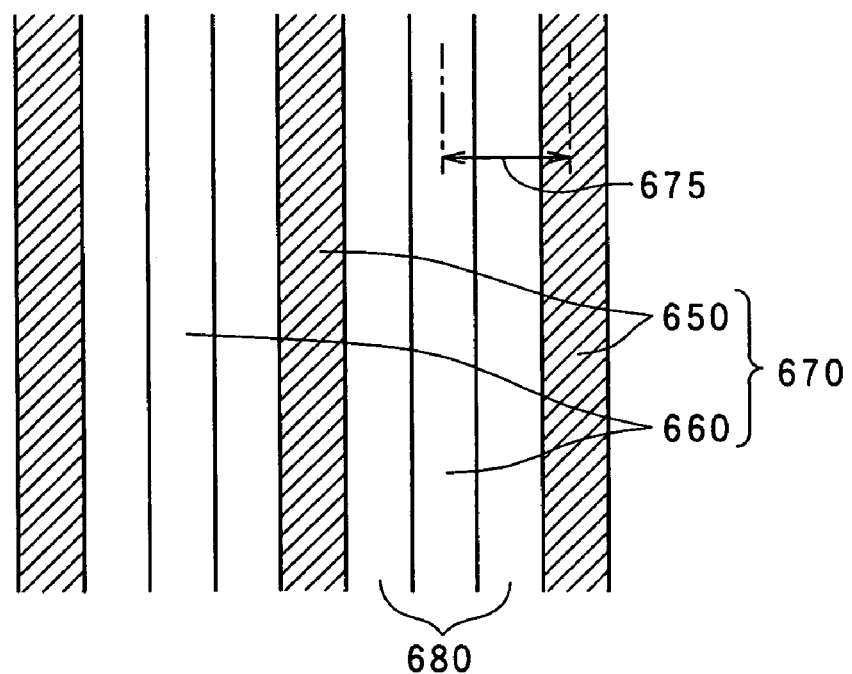
FIG. 5B is a view which shows the arrangement of the line and space pattern.

FIG. 1A–FIG. 1I are sectional views showing the structure at each step in the process in one embodiment of the method of manufacturing the phase shift mask according to the first invention, wherein the structure shown in FIG. 1I is an embodiment of the phase shift mask according to this invention. FIG. 5A is a chart which shows the distribution of the optical intensity at adjoining translucent parts (line parts) on the wafer when applying the constituent of the phase shift mask of this invention to the line and space pattern and projecting light thereto, and FIG. 5B is a view which shows the arrangement of the line and space pattern.

In FIG. 1A–FIG. 1I, the reference numerals indicate parts as follows: 110 denotes a substrate (also called a "transparent substrate".), 115 a dug-down 116 a side wall part, 120 a resist, 125 an opening, 130 a dry etching gas, 150 a shading film, 155 an opening, 160 a resist, 165 an opening, 180 a shifter part (translucent part), 185 a non-shifter part (translucent part), 190 a step-difference part. In FIG. 5A–FIG. 5B, the reference numerals indicate parts as follows: 650 denotes a translucent part (also called a "line part" or a "line pattern part") of depth d1=0 in the recess, 650A the light intensity on the wafer, 660 a translucent part (also called a "line part" or a "line pattern part") of depth d2 in the recess, 660A the light intensity on the wafer, 670 a translucent part (also called a "line part" or a "line pattern part"), 675 the pitch between adjacent lines on the mask, 675A the pitch between lines on the projected image, 680 a shading part (shading film), 690 the profile of optical intensity (on the wafer), and 680 a threshold.

The phase shift mask according to the first invention is illustrated with reference to FIG. 1I.

The engraving type phase shift mask in this embodiment is a single side engraving type phase shift mask which comprises a shifter part 180 and a non-shifter part 185 mutually adjacent on a substrate, and which has a shading layer pattern formed with a shading film 150 which covers continuously from the end of the shifter part 180 to the adjacent end of the non-shifter part 185 including the side wall part 116 of the dug-down part 115 for forming the shifter part 180, and the side wall part 116 inclines so that the above-mentioned side wall part may spread toward the surface of the substrate 110.

It is desirable to have a side wall part 116 inclination angle ëof 15° to 35° from the plumb line v that is perpendicular to the surface of the substrate 110. The inclination angle, however, is not particularly limited to the above-stated range.

When the inclination angle is within the range of 15° to 35°, as opposed to no inclination at all, the homogeneity of film formation of a shading film becomes significantly better, and such inclination is not so worrisome that the boundary between the surface flat part of the substrate 110 and dug-down part 115 becomes unclear more than necessary.

The substrate 110 and the shading layer to be used are a substrate transparent to the exposure light which is used at the time of the projection exposure to the wafer, and a film which has shading property to the same exposure light.

Usually, quartz or synthetic quartz are typically used for the substrate 110, and a chromium-base, chromium monolayer, or as needed, a chromium layer laminated with chromium oxide, chromium nitride, and/or chromium nitride oxide are typically used for the shading film 150.

For the exposure light, it is preferable, but not restricted to, the usage of a KrF excimer laser with a wavelength of 248 nm, an ArF excimer laser with a wavelength of 193 nm, or an F2 excimer laser with a wavelength of 157 nm.

Usually, when the wavelength of the exposure light is used, the depth D0 of the dug-down part 115 for formation of shifter part 180 is set to almost ë/2 (n−1), wherein ë is the wavelength of the exposure light and n is the refractive index of the substrate 110.

Concretely, although it is not particularly limited the desirable depth D0 should be in the range of about ë/2 (n−1)±5%, and preferably, it should be about ë/2 (n−1)±3%, and even more preferably, it should be about ë/2 (n−1)±1%, and most preferably, it should be exactly ë/2 (n−1). When the depth DO is within the range of ë/2 (n−1)±5%, a good phase difference for the one-side engraving type phase shift mask can be obtained.

For a pattern of a phase shift mask, a phase shift mask which has the line pattern (translucent part 670) of the arrangement shown in FIG. 5B, and having one section shown in FIG. 1I may be cited.

Here, ë is the wavelength of exposure light and n is the refractive index of a substrate, and the depth of one recess of the adjacent translucent parts (line pattern) 670 is set into almost ë/2 (n−1), by digging down the part of the substrate which is exposed from the shading film 680.

The depth d1 of the recess (the depth the dug-down) of the translucent part (line part) 650 is 0, and the depth d2 of the recess of the translucent part (line part) 660 is almost ë/2 (n−1).

Next, one embodiment of the manufacture method of the phase shift mask according to this invention is illustrated with reference to FIG. 1A–FIG. 1I.

This embodiment is the method of manufacturing a phase shift mask shown by FIG. 1I. The explanation for the manufacture method of the phase shift mask of the embodiment shown in FIG. 1I is replaced with the following description.

First, on one side of the substrate 110, which is transparent to the exposure light of wavelength ë and having a refractive index n (FIG. 1A), the resist film 120 is formed by the conventional photolithography method, having predetermined openings which match the dug-down parts to be formed (FIG. 1B), then by using the obtained resist film as an etching-proof mask the dry etching is carried out (FIG. 1C) to obtain the dug-down parts 115 (FIG. 1D).

Since the dry etching is anisotropic, the digging (etching) will proceed only in a direction that is approximately perpendicular to the face of the substrate.

Digging depth can be precisely controlled by using a phase difference measurement device (Laser Tec MPM-248) etc.

Using fluoride-base gas, such as $CF_4$ gas and $CFH_3$ gas, as gas for etching, dry etching is carried out selectively in order to obtain the predetermined depth DO (usually equivalent to ë/2 (n−1)).

Since the wet etching method is of isotropic and the digging (etching) will function omnidirectionally at about the same speed, this method is not used for this step.

For the resist film 120, there is used a decreasing film from dry etching, and the width of the opening 125 of a resist film is expanded gradually by the effect of the decreasing film.

By the fact that the width of the opening 125 of resist film is enlarged gradually at the same rate as the dry etching, the side wall 116 is formed with an incline that spreads toward the substrate surface.

Such products as IP3500 (commercialized by TOKYO OHKA KOGYO CO., LTD.), THMR-M100 (commercialized by TOKYO OHKA KOGYO CO., LTD.), etc. can be used for forming the resist film 120. The resist film 120 is exposed by a laser drawing apparatus (for example, ALTA3000 commercialized by ETEC), or a photorepeater, which is described later, such as, a photorepeater transfer unit (for example, NSR-365 commercialized by Nikon).

In this exposure, the problem of rising charges, associated with an electronic beam exposure apparatus, can be eliminated.

Subsequently, the resist film 120 is exfoliated and removed from the substrate by a predetermined exfoliation liquid, and the substrate is washed (FIG. 1E). Then, a shading film 150 is formed on the whole area of the dug-down part 115 forming side of the substrate 110 (FIG. 1F).

The shading film 150 is typically chromium-based, a chromium monolayer, or as the occasion demands, a chromium layer laminated with chromium oxide, chromium nitride, and/or chromium nitride oxide, etc.

Next, by the photolithographic method, the resist layer 160 is formed with a predetermined shape on the shading film 150 (FIG. 1G).

The areas which correspond to the shifter part and the non-shifter part of the phase shift mask to be obtained are opened in the resist layer.

The resist layer 160 is not particularly limited, as long as it can serve as an etching-proof resist at the time of etching the shading film 150, it can possess a proper processing ability, and a capability of giving an intended resolution.

Next, the shading film 150 exposed from the opening 165 of the resist film 160 is removed by etching (FIG. 1H). When using chromium, chromium nitride oxide, etc. as a shading film 150, this etching may be performed using ammonium cerium nitrate solution, or a dry etching using chlorine-base gas.

Then, the resist film 160 is exfoliated and removed, and the obtained substrate is subjected to washing, etc., and eventually, the substrate engraving type phase shift mask is obtained (FIG. 1I).

In FIG. 1I, numerals 180 and 185 denote a shifter part (translucent part) and a non-shifter part (translucent part), respectively.

Figure 7:
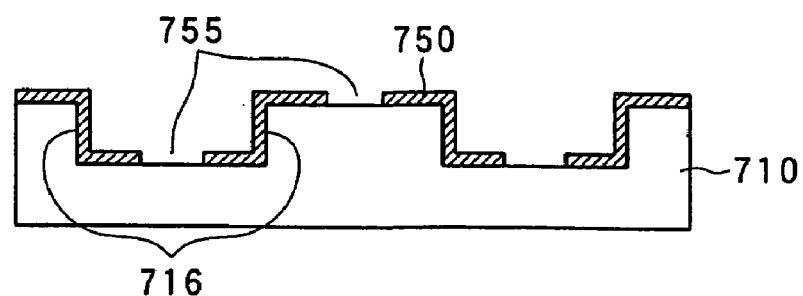
FIG. 7 is a partial sectional view showing another example of the conventional one-side engraving type phase shift mask.
Figure 9:
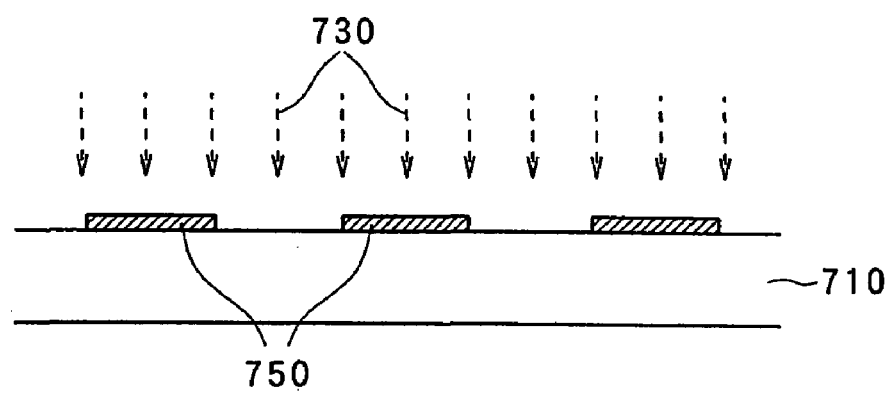
FIG. 9 is a partial sectional view showing an engraving type phase shift mask in progress of the production different from the manufacture methods of the engraving type phase shift mask shown in FIG. 1 and FIG. 2.

Besides, in the case of the phase shift mask shown in FIG. 7 and in FIG. 9, after the construction of the shading film 750 into the predetermined shape, the substrate 710 is etched by using both the shading film 750 and resist film 720, or just the shading film 750 as the etching proof layer. Therefore, in FIG. 7 only, the width of the opening 755 in the etching-proof layer does not change, and the side wall of the dug-down part (recess) is formed without an incline.

In FIG. 9, numeral 730 denotes the dry etching gas.

2. Phase Shift Mask Having Round Shaped Bottom Edges of Side Wall of the Dug-down Part Next, an embodiment of the second invention will be described.

Figure 2A:
Figure 2B:
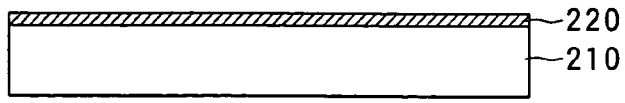
Figure 2C:
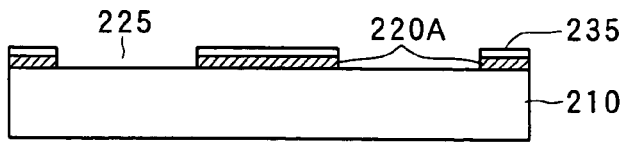
Figure 2D:
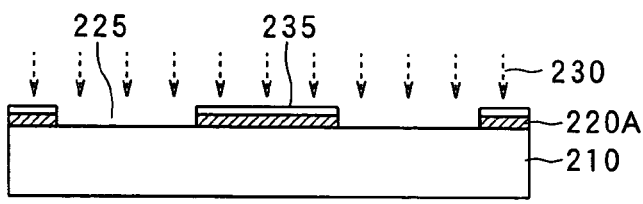
Figure 2E:
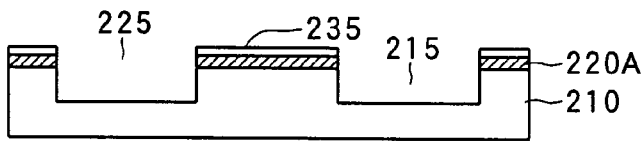
Figure 2F:
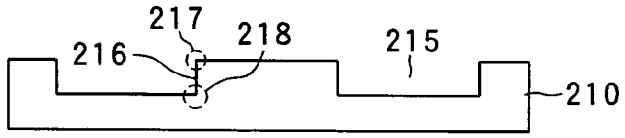
Figure 2G:
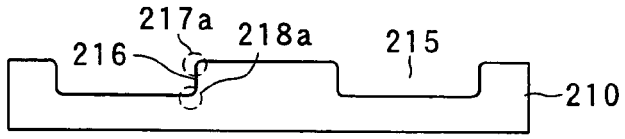
Figure 2H:
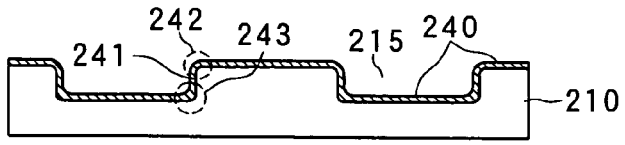
Figure 2I:
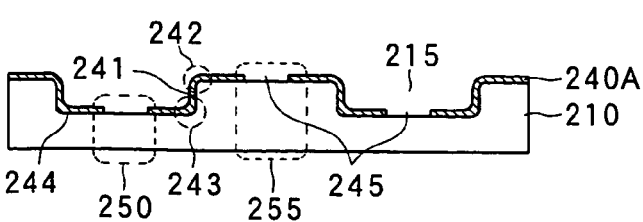

FIG. 2A–FIG. 2I are sectional views showing the structure at each process step in one embodiment of the method of manufacturing the phase shift mask according to the second invention, wherein the structure shown in FIG. 2I is an embodiment of the phase shift mask according to this invention. As already mentioned above, FIG. 5A is a chart which shows the distribution of the optical intensity at adjoining translucent parts (line parts) on the wafer when applying the constituent of the phase shift mask of this invention to the line and space pattern and projecting light thereto, and FIG. 5B is a view which shows the arrangement of the line and space pattern.

In FIG. 2A–FIG. 2I and FIG. 8A–FIG. 8I, the numeral 210 denotes a substrate (also called "transparent substrate".), 215 a dug-down part (also called a "recess".), 216 a side wall part, 217 and 217a top edges, 218 and 218a bottom edges, 220 a metal film, 220A a metal film pattern, 225 an opening, 230 a dry etching gas, 235 a resist film, 240 a shading film, 240A a shading film pattern, 245 an opening, 250 a shifter part (translucent part), 255 a non-shifter part (translucent part), respectively. As mentioned above, in FIG. 5A–FIG. 5B, the numeral 650 denotes a translucent part (also called a "line part" or a "line pattern part") of depth d1=0 in the recess, 650A the light intensity on the wafer, 660 a translucent part (also called a "line part" or a "line pattern part") of depth d2 in the recess, 660A the light intensity on the wafer, 670 a translucent part (also called a "line part" or a "line pattern part"), 675 the pitch between adjacent lines on the mask, 675A the pitch between lines on the projected image, 680 a shading part (shading film), 690 the profile of optical intensity (on the wafer), and 695 a threshold, respectively.

An embodiment of the manufacture method of the phase shift mask according to the first invention is illustrated with reference to FIG. 2.

This embodiment is a method of manufacturing a phase shift mask for preparing the single-side engraving type phase shift mask, on which the shifter part and the non-shifter part are mutually adjacent on a substrate, and where the shading film pattern is formed with a shading film which covers continuously from the end of the shifter part to the adjacent end of the non-shifter part including the side wall part of the dug-down part for forming the shifter part. Further in this embodiment, manufacturing of a single-side engraving type phase shift mask which has the line pattern (translucent part 670) of arrangement as shown in FIG. 5B, and one section thereof is shown by FIG. 2I, and wherein the mutually adjacent translucent parts 670 are formed by digging down the substrate at the areas exposed from the shading film, the substrate being transparent to the exposure light of wavelength ë and having a refractive index n, so as to satisfy the condition that d1=0 and d2 is almost equal to ë/2(n−1), wherein d1 is for the depth of one recess, d2 for the depth of another recess, is illustrated.

First, a substrate 210 which is flat on both sides and transparent to the exposure light of the wavelength e, is prepared (FIG. 2A), and a metal film 220 is formed on one side of the substrate (FIG. 2B).

Then, the metal film is photoetched to provide a metal film pattern 220A which is made of the metal film 220, and which has, as openings, dug-down part forming areas which are arranged for subsequent shifter part formation on one side of the substrate 210 (also called a "photomask blank") (FIG. 2C).

After the growth of the metal film 220 to a substrate 210 by the sputtering method, the vapor-depositing method, etc., the resist film 235, which has predetermined openings which match to the desired metal pattern, is formed by the conventional photo lithography method. Then by using the obtained resist film as an etching-proof mask the dry etching, wet etching or the like is carried out in order to obtain the metal film pattern 220A which is made of the metal film 220 and has a desired shape.

As for the substrate 210, which is flat on both sides and transparent to the exposure light of wavelength ë, typically, quartz and synthetic quartz are used like in the above mentioned first invention.

When using chromium, chromium nitride oxide, etc. as the metal film 220, this etching may also be carried out by dry etching using chlorine-based gas the as etchant.

The resist to be used is not particularly limited, as long as it possesses a proper processing ability, a capability of giving an intended resolution, and has anti-etching properties.

Then, by dry etching using the obtained resist film 235 and the metal film pattern 220A as the etching-proof mask, the substrate is dug down to provide the depth d0 of the dug-down part (recess) which is almost equal to ë/2 (n−1). (FIG. 2D, FIG. 2E).

Digging depth may be controlled precisely by using a phase difference measurement device, etc., as described above.

Since the dry etching is anisotropic, the digging (etching) in this case will proceed only in the direction approximately perpendicular to the face of the substrate.

Using a fluoride-base gas such as $CF_4$ gas as an etchant, dry etching is carried out to the transparent substrate part exposed from the openings.

The resist to be used is not particularly limited, as long as it possesses a proper processing ability, a capability of giving an intended resolution, and has anti-etching properties.

In addition, depending on the case, it is also possible to dig down the substrate by dry etching without preparing a resist film on the metal film pattern 750, as shown in FIG. 9.

In FIG. 9, numerals 710, 730 and 750 denote the substrate, dry etching gas, and metal film pattern, respectively.

After the dry etching, the resist film 235 is removed, and the metal film pattern 220A made of metal film 220 is exfoliated, and the substrate is washed (FIG. 2F). Then, a wet etching is carried out to the whole area of the dug-down part 215 forming side of the substrate 210 (FIG. 2G).

Since the wet etching is isotropic, its digging (etching) will function omnidirectionally at about the same speed.

Hydrofluoric acid solution or heat alkali solution may be used as the etchant for wet etching.

It is desirable that the amount of etching in the wet etching is of 10 nm–100 nm.

Next, a shading film 240 is formed on the whole area of the dug-down part 215 forming side of the substrate 210 including the side walls in the dug-down parts (recesses) for forming the shifter part (FIG. 2H), and then, by the photo-etching method, a shading layer pattern 240A made of a shading film 240 and having openings at the shifter parts and the non-shifter parts is formed (FIG. 2I).

After forming the shading film 240 onto the substrate 210 by the sputtering method, the vapor-depositing method, etc., a resist film (not shown) which has predetermined openings that match the shape of the shading part to be obtained is formed by the conventional photolithography method as mentioned above, then by using the obtained resist film as an etching-proof mask the dry etching, wet etching or the like is carried out in order to obtain the shading film pattern 240A which is made of the shading film 240 and has a desired shape.

Then, the resist film for the formation of the shading film pattern 240A is removed, and washing is carried out.

When using chromium or chromium nitride oxide as the shading film 240, this etching may also be carried out by dry etching using a chlorine-base gas as an etchant.

The resist to be used is not particularly limited, as long as it possesses a proper processing ability, a capability of giving an intended resolution, and having anti-etching properties.

Thus, the one-side engraving type phase shift mask shown in FIG. 2I can be manufactured. In this embodiment, since wet etching is carried out after exfoliating the metal film pattern 220A made of the metal film 220 (FIG. 2F), the top edge part 217 and bottom edge part 218 of the side wall 216 in the dug-down part 215 shown in FIG. 2F are round, and they appear as illustrated in FIG. 2G, as the top edge part 217a and bottom edge part 218a, respectively. Thus, at the formation of the shading film 240, the film can be uniformly formed onto these areas as with that onto the flat areas (FIG. 2H).

As a result, even when the shading pattern 240A is further formed by etching the shading film 240, and then the shifter part 250 and the non-shifter part 255 is formed, the possibility of generating shading film defects at the top edge part 217 and bottom edge part 218 of the side wall 216 in the dug-down part 215 would be eliminated.

As to the degree of roundness at the top edge 217 and bottom edge part 218 of the side wall 216 in the dug-down part 215, it is desirable to have a curvature radius in the range of about 60 to 250 nm but it is not necessarily limited to this range. When a curvature radius is within the range of 60 to 250 nm, as compared to the case where it is not rounded at all, the homogeneity of film formation of a shading film improves significantly, and with such a radius it is not so worrisome that the boundary between the surface flat part of the substrate 110 and dug-down part 115 becomes unnecessarily unclear.

Next, one embodiment of the phase shift mask of this invention will be described.

This example was produced by the manufacturing method shown in FIG. 2, which shows the one section to FIG. 2I, and which has the line pattern (translucent part 670) of arrangement shown in FIG. 5B. By deeply recessing the transparent substrate part of a line pattern (translucent part 670), the adjacent translucent parts in which one recess depth is $d_1 = 0$ and another recess depth $d_2$ is almost equal to $ë/2(n-1)$ are formed.

Wherein, ë is the wavelength of exposure light and n is the refractive index of a substrate 210.

As a substrate 210, the substrate which is transparent to the exposure light used in the projection exposure to a wafer, and as a shading layer, the film which has a shading property to the exposure light in the projection exposure to a wafer is used.

Generally, similar to the substrate 110 of the first invention, quartz and synthetic quartz are typically used as a substrate 210, and, similar to the shading film of the first invention, a chromium based film or chromium monolayer film are typically used, but, if required, a chromium layer laminated with chromium oxide, chromium nitride, and/or chromium nitride oxide, etc. may also be used.

Similar to the first invention, excimer lasers, including but not limited to KrF, ArF, and F2, may be used as the exposure light.

As a pattern of a phase shift mask, for example, a phase shift mask which has the line pattern (translucent part 670) arrangement as shown in FIG. 5B, and having one section shown in FIG. 2I may be cited.

Here, ë is the wavelength of exposure light and n is the refractive index of a substrate, and the depth of one recess of the adjacent translucent parts (line pattern) 670 is set into almost $ë/2(n-1)$, by digging down the substrate part which is exposed from the shading film 680.

The depth $d_1$ of the recess (the depth for dug-down) of the translucent part (line part) 650 is 0, and the depth $d_2$ of recess of translucent part (line part) 660 is almost $ë/2(n-1)$.

Although it is not particularly limited, the depth D0 should be in the range of about $ë/2(n-1) \pm 5\%$, preferably it should be about $ë/2(n-1) \pm 3\%$, even more preferably it should be about $ë/2(n-1) \pm 1\%$, and most preferably it should be exactly $ë/2(n-1)$. When the depth D0 is within the range of $ë/2(n-1) \pm 5\%$, a good phase difference as the one-side engraving type phase shift mask can be obtained.

3. Exposure by Photorepeater

An embodiment of the third invention is now illustrated with reference to the drawings.

Figure 4:
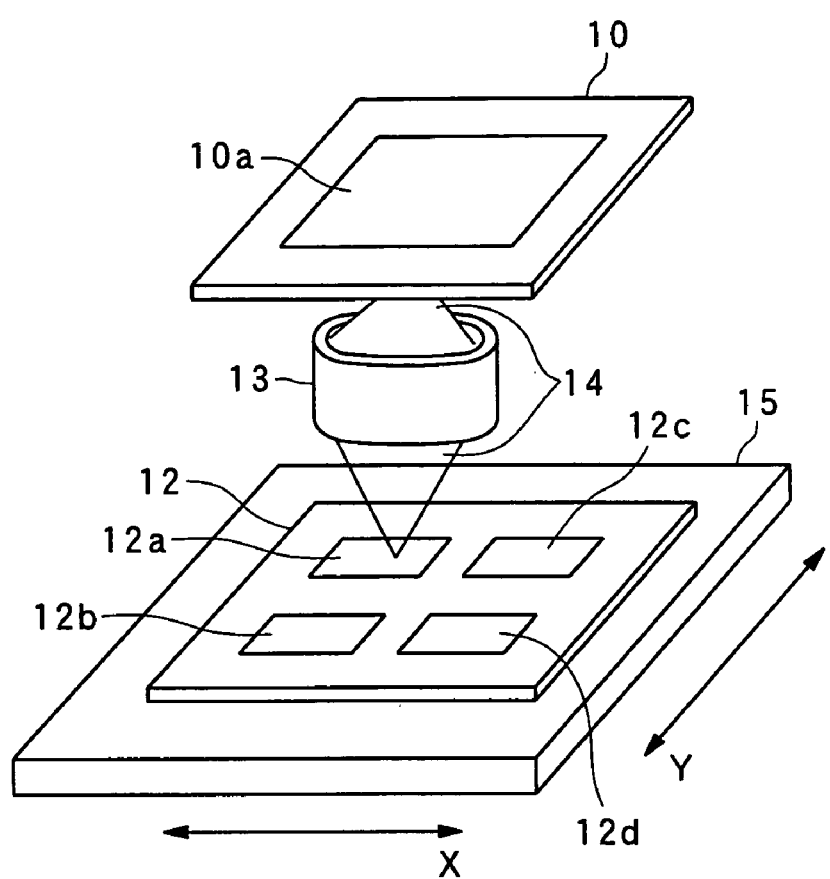
FIG. 4 is an outline view for explaining exposure by the photorepeater.

FIG. 3 is the outline process flow chart explaining the feature process of two embodiments of the method of manufacturing the third phase shift mask of this invention, and FIG. 4 is an outline explaining exposure by the photorepeater.

In FIG. 3, the process shown by a thin arrow shows the first mode of the embodiment, and the process shown by a thick arrow shows the second mode of the embodiment. S300–S370 show processing steps, respectively, and the sectional views in Steps S300, S310, S311, S320, S350, S351, and S360 show the section of the feature part of the mask to be manufactured, respectively.

In FIG. 3, numeral 310 denotes a substrate (also called "transparent substrate".), 320 a metal film, 320A a metal film pattern, 321 an opening, 330 and 335 resist films (it is also called "photoresist".), 330A and 335A resist patterns, 331 and 336 openings, respectively. In FIG. 4, numeral 10 denotes a parent mask (also called "master mask".), 10a an exposed area, 12 a secondary mask (phase shift mask to be obtained.), 12a, 12b, 12c, and 12d areas to be exposed, 13 a lens system, 14 an exposure light, and 15 an X-Y stage.

First, the feature part of one embodiment of the method for manufacturing the phase shift mask of the third invention is illustrated with reference to FIG. 3.

First, the process flow of the first mode of the embodiment is explained briefly.

The first mode is that for manufacturing a single side engraving type phase shift mask which comprises a shifter part and a non-shifter part mutually adjacent on a substrate, and which has a shading layer pattern formed with a shading film which has a shading property to exposure light and which covers continuously from the end of the shifter part to the adjacent end of the non-shifter part including the side wall part of the dug-down part for forming the shifter part (recess), and wherein as the patterning of a dug-down part forming area for giving the shifter part, a photoresist is coated on one side of the substrate via a metal film, a dug-down part forming area for giving the shifter part in the formed photoresist is selectively exposed by using a photorepeater, and then the exposed photoresist is developed to obtain the resist pattern having an opening as the dug-down part forming area.

However, the above-mentioned metal film should be tolerant at least to the etching gas which is used at the time of digging down a substrate deep by dry etching.

First, a substrate 310 which is flat on both sides and transparent to the exposure light (wavelength ë) is prepared (S300), and a metal film 320 is formed on one side of the substrate (S310).

For the substrate 310, transparent to the exposure light of wavelength, quartz and synthetic quartz are typically used.

For the metal film 320, a chromium monolayer, or layer stack wherein a chromium layer is laminated with chromium oxide, chromium nitride oxide are typically used, and it can be deposited on the substrate 310 by the sputtering method, the vapor depositing method, etc.

Then, after forming the resist film 330 all over the metal film 320 (S311), resist pattern 330A is formed by selectively exposing the dug-down forming area with the photorepeater (S330), developing the exposed one (S340), in order to open the dug-down forming area (S350).

Then, the metal film 320, exposed from the opening 331 of resist pattern 330A, is etched in order to form a shading film pattern (S351). After that, it progresses to substrate engraving processing (S370) by using resist pattern 330A and metal film pattern 320A as an etching-proof mask.

When using a chromium-based metal film 320, as mentioned above, this etching may be performed using ammonium cerium nitrate solution, or by dry etching using a chlorine-base gas as the etchant.

The resist film 330 is not particularly limited, as long as it possess a proper processing ability, a capability of giving an intended resolution, and anti-etching properties.

This example is enabling the enhancement of process efficiency by using the photorepeater.

Next, the flow of the second mode of an embodiment is explained briefly.

Similar to the first mode, the second mode is that for manufacturing a single side engraving type phase shift mask which comprises a shifter part and a non-shifter part mutually adjacent on a substrate, and which has a shading layer pattern formed with a shading film which has a shading property to exposure light and which covers continuously from the end of the shifter part to the adjacent end of the non-shifter part including the side wall of dug-down part for forming the shifter part (recess). However, in the second mode, as for the patterning for a dug-down part forming area for giving the shifter part, a photoresist is coated directly on one side of the substrate, a dug-down part forming area for giving the shifter part in the formed photoresist is selectively exposed by using a photorepeater, and then the exposed photoresist is developed to obtain the resist pattern having an opening as the dug-down part forming area.

First, a substrate 310 which is flat on both sides and transparent to the exposure light (wavelength) is prepared (S300) as in the case of the first mode. Then, after forming the resist film 335 all over the one side of substrate (S320), resist pattern 335A is formed by selectively exposing the dug-down forming area with the photorepeater (S330), developing the exposed one (S340), in order to open the dug-down forming area (S350).

After that, it progresses to substrate engraving processing (S370) by using resist pattern 335A as an etching-proof mask.

The resist film 335 is not particularly limited, as long as it possesses a proper processing ability, a capability of giving an intended solution, and anti-etching properties.

This example also enables the enhancement of process efficiency by using the photorepeater.

Next, the exposure by the photorepeater is briefly illustrated with reference to FIG. 4. In order to give an intelligible explanation, the following description is based on an assumption that the pattern of exposure domain 10a in the parent mask (also called "master mask") 10 shall be projected and exposed to the respective secondary masks 12 (corresponding to those of steps S311, S320 in FIG. 3) with a predetermined pitch and 2×2 matrix arrangement. However, in actuality, the matrix and pitch should be aligned to the phase shift mask to be manufactured.

The secondary masks 12 are fixed to the X-Y stage 15, and by the X-Y stage 15, the secondary masks 12 are moved in the X and Y directions, and it is in the state in which it is stopped in the predetermined position that operations are carried out repeatedly which result in reduction projection of the whole pattern of exposure domain 10a in the parent mask 10 through the lens system 13 on the secondary masks 12.

While the relative position of the lens system 13 and the parent mask 10 is fixed, the above-mentioned operations are repeated.

Thereby, reduction projections of the whole pattern of exposure domain 10a in the parent mask 10 are carried out by the lens system 13 to the exposed domains 12a, 12b, 12c, and 12d of the secondary masks 12, respectively. As mentioned in advance, since the substrate dug-down parts serve as a repetition pattern and the resist patterning for the formation of the dug-down part forming area may be less accurate, the exposure by the photorepeater can be used for the above resist patterning.

Thus, the enhancement of process efficiency can be attained by using the photorepeater on the exposure of this resist patterning.

Further, the exposure accuracy of the photorepeater to be used may be also low.

There is also no necessity of using excimer lasers, such as KrF (248 nm wavelength), where the illumination-optical system becomes complicated.

Next, one example which produces the phase shift mask according to the first invention shown in the above mentioned FIG. 1I is given using the method of manufacturing the phase shift mask of the second mode of the embodiment, with reference to FIG. 1A–FIG. 1I.

First, as described in the first invention mentioned above, a transparent substrate 110 (FIG. 1A) which is transparent to the exposure light (wavelength ë) and having the refractive index n is prepared. Then, as the second embodiment shown in FIG. 1, resist film formation (S320), exposure by the photorepeater (S330), and developing (S340), are carried out in order to obtain the resist film which is directly formed on the substrate, and which has predetermined openings that have shapes corresponding to those of the dug-down part to be formed (FIG. 1B).

Since the dug-down part forming area has a simple repetition pattern and the exposure is carried out by the photorepeater, the time spent for exposure can be sharply shortened, as compared with the drawing time in the case of using an electronic beam exposure equipment or photograph drawing equipment.

After that, as explained in the first invention, by using the resist film 120 as an etching-proof mask, dry etching is carried out (FIG. 1C) in order to form the dug-down part 115 (FIG. 1D).

As mentioned above, since the dry etching is anisotropic, the digging (etching) in this case will proceed only in the direction approximately perpendicular to the face of the substrate.

Digging depth can be controlled using a phase difference measurement device, etc., as described above.

Since the explanations about the etching gas to be used, about the depth D0, about the resist film 120, about the exposure method for resist film 120, and about subsequent process steps (FIG. 1E–1I) thereafter, are almost the same with those concerned with the first invention, the explanations are omitted at this place.

Next, one example which produces the phase shift mask according to the second invention shown in the above mentioned FIG. 2I is given using the manufacture method of the phase shift mask of the first mode of the embodiment.

First, as described in the second invention mentioned above, a transparent substrate 210 (FIG. 1A) which is transparent to the exposure light of the wavelength ë is prepared. Then, as the first embodiment shown in FIG. 3, a first metal film 220 is formed on one side of the substrate 210 (FIG. 2B, corresponding to S310 of FIG. 3), a resist is formed all over the metal film 220 (corresponding to S311 of FIG. 3). After exposure by the photorepeater (S330), developing (S340) is carried out in order to obtain the resist film 235 which is formed on a side of the substrate 210 via metal film 220, and which has predetermined openings that have shapes corresponding to those of the dug-down part to be formed (corresponding to S350 of FIG. 3). Further, by using the obtained resist film 235 having desired openings as the etching-proof mask, the shading film is etched so as to etch the shading film which is exposed from the opening to provide a shading film pattern which has openings for the dug-down part forming area (FIG. 2C, corresponding to S351 of FIG. 3).

Similar to above case, since the dug-down part forming area has a simple repetition pattern and the exposure is carried out by the photorepeater, the time spent for exposure can be sharply shortened, as compared with the drawing time in the case of using an electronic beam exposure equipment or photograph drawing equipment.

Then, as explained with respect to the second invention, and thereafter as described above, by carrying out each of the steps of FIG. 2C to FIG. 2I, the above mentioned shading layer pattern 240A made of the shading film 240 and which has openings at shifter parts and at non-shifter parts is formed (FIG. 2I).

Since the explanations about the raw materials, conditions, etc., to be used in this process are almost the same with those concerned with the second invention, the explanations are omitted at this place.

EXAMPLES

Although the following examples are given and this invention is explained more concretely, the examples shown below are only for the purpose of the understanding this invention, and this invention is not limited at all by these cited examples.

Example 1

Example 1 is an example of the manufacturing of a Levenson type phase shift mask for KrF which has a section view as shown schematically in FIG. 1I, and has a line pattern arrangement as shown in FIG. 5B, by using the manufacturing method shown in FIG. 1.

First, onto one side of the transparent substrate 110 (FIG. 1A) which is made of a synthetic quartz substrate (henceforth "Qz substrate") with a thickness of 6.3 mm, a resist IP3500 (commercialized by TOKYO OHKA KOGYO CO., LTD.) was coated to 4650 Å. Then, it was exposed with laser drawing equipment (ALTA3000 commercialized by ETEC), and negatives were developed by the inorganic alkali developing solution in order to form the resist film 120 with a predetermined form. (FIG. 1B)

Next, in order to form a shifter part, dry etching using $CF_4$ gas was carried out (FIG. 1C), the substrate was etched to an amount for 180° phase difference (depth: 245 nm) and the dug-down part 115 was formed (FIG. 1D). Since a decrease in the resist film 120 accompanied the etching of the substrate 110, the opening width pattern was spread with the time course, and finally, the etching was finished in the state where the side wall 116 of a dug-down part 115 was inclined so that it was spread toward the surface (é=20°) as shown in FIG. 1D.

Subsequently, after exfoliating the resist film 120 and carrying out the washing treatment (FIG. 1E), all over the dug-down part 115 forming side of the substrate 110, a chromium film and a chromium oxide film were formed at 110 nm, and several nm (about 6–8 nm), respectively, by the sputtering method in order to form a shading film 150 (FIG. 1F)

The shading film 150 was uniformly formed on the whole area, including the side wall part 116 as well as the flat surface part of a substrate 110 and the bottom part of the dug-down part 115.

Then, on the shading film 150, resist ZEP (commercialized by Nippon Zeon Co., Ltd.) was applied, it was drawn with electron beam drawing equipment HL800 (commercialized by Hitachi, Inc.), negatives were developed by the inorganic alkali developing solution, and the resist film 160 was formed at a predetermined form (FIG. 1G).

The shading film 150 which was exposed from the openings 165 of the resist film 160 and which comprised the chromium oxide and chromium was then dry etched by a mixed gas which includes chlorine as the main ingredient (FIG. 1H).

Thereafter, the resist film was exfoliated with a predetermined exfoliation liquid, a washing treatment was carried out, and thereby, the one-side engraving type phase shift mask of this invention shown in FIG. 1I was produced.

This obtained the phase shift mask which is shown in FIG. 5B and where the opening size of the shading film 680 of the line pattern (translucent part) 650 in the dug-down part was made to be 0.6 μm, and the opening size of the shading film 680 of the line pattern (translucent part) 660 of the not dug-down part (the recess depth is 0) was made to 0.6 μm, and the pitch of these openings was set to 1.2 μm.

The projection exposure was carried out on the wafer using the obtained one-side engraving type phase shift mask. After development, the resist image of the line pattern 660 (translucent part) in the mask dug-down part and the resist image of the line pattern 650 (translucent part) in the part into which a digging of a mask was not put (recess depth=0) were formed with the same size.

As a result of measuring the optical intensity on a wafer using the simulator MSM100 commercialized by the Carl Zeiss Company, etc., it became as shown in FIG. 5A.

The optical intensity profile 690 on a wafer became as shown in FIG. 5A, and a difference was hardly seen between the optical intensities 650A and 660A on the wafer with respect to the adjacent line patterns corresponding to the line pattern parts (translucent parts) 650 and 660, respectively.

Example 2

Example 2 is an example for manufacturing of a Levenson type phase shift mask for KrF which has a section view as shown schematically in FIG. 2I, and has a line pattern arrangement as shown in FIG. 5B, by using the manufacturing method shown in FIG. 2A–2I.

First, onto one side of transparent substrate 210 (FIG. 2A) which is made of a synthetic quartz substrate (henceforth "Qz substrate") with a thickness of 6.3 mm, a photomask blank (FIG. 2B) which is made of the metal film 220 comprising chromium (110 nm in thickness) and chromium oxide (6–8 nm in thickness) was layered. Then, onto the metal film 220, a resist ZEP (commercialized by Nippon Zeon Co., Ltd.) was coated to 3000 Å. Then, it was drawn with electronic beam drawing equipment HL800 (commercialized by Hitachi, Inc.), and negatives are developed by the inorganic alkali developing solution in order to form the resist film (not shown) with a predetermined form. Next, the metal film 220 which is formed with chromium oxide and chromium located at the opening was dry etched by a chlorine-base gas, and thereafter the resist film was exfoliated (FIG. 2C).

Next, a dry etching using $CF_4$ gas was carried out in order to form the shifter part, the substrate 210 was dug down so that the depth of dug-down part (recess) was almost equal to ë/2 (n−1) (depth: 245 nm), wherein ë is the wavelength of exposure light, and n is the refractive index of the substrate 210 (FIG. 2D, FIG. 2E).

The resist film 235 was removed, and the metal film 220 was exfoliated (FIG. 2F), and 40 nm wet etching was performed all over substrate 210 using hydrofluoric acid solution.

Thereby, the upper edge 217a and the bottom edge 218a in the substrate dug-down part 215 were round (curvature radius of about 100 nm) (FIG. 2G).

Sputtering formation of the shading film 240 which is comprised of chromium oxide (6–8 nm in thickness) and chromium (110 nm in thickness) was carried out all over the dug-down part 215 forming side of substrate 210 (FIG. 2H).

Since the shading film 240 was formed in the state where the upper edge 217a and the bottom edge 218a in the substrate dug-down part 215 were round (FIG. 1G), the films were uniformly formed on the whole area, including the area around the upper edge 217a and the area around the bottom edge 218a in the substrate dug-down part 215 as well as the other flat surface part of the substrate.

Then, on the shading film 240, resist ZEP (commercialized by Nippon Zeon Co., Ltd.) was applied to 3000 Å, it was drawn with an electronic beam drawing equipment HL800 (commercialized by Hitachi, Inc.), negatives were developed by the inorganic alkali developing solution, and the resist film was formed at predetermined form. Further, the shading film 240, which was exposed from the openings and which is comprised of the chromium oxide and chromium was dry etched by a chlorine-base gas. Thereafter, the resist film was exfoliated with a predetermined exfoliation liquid, washing treatment was carried out, and thereby, the one-side engraving type phase shift mask of this invention shown in FIG. 2I was produced.

This produces the phase shift mask which is shown in FIG. 5B and where the opening size of the shading film 680 of the line pattern (translucent part 650) in the dug-down part was made to be 0.6 μm, and the opening size of the shading film 680 of the line pattern (translucent part 660) of the not dug-down part (the recess depth is 0) was made to be 0.6 μm, and the pitch of these openings was set to 1.2 μm.

The projection exposure was carried out on the wafer using the thus obtained one-side engraving type phase shift mask. After development, the resist image of the line pattern (translucent part 650) in the dug-down part of the mask and the resist image of the line pattern (translucent part 660) in the part where there was no digging of the mask (recess depth=0) were formed with the same size.

As a result of measuring the optical intensity on a wafer using the simulator MSM100 commercialized by the Carl Zeiss Company, etc., it became as shown in FIG. 5A.

The optical intensity profile 690 on a wafer became as shown in FIG. 5A, and a difference was hardly seen between the optical intensities 650A and 660A on the wafer with respect to the adjacent line patterns corresponding to the respective line pattern parts (translucent parts) 650 and 660.

Comparative Example 1

This comparative example will be illustrated with reference to FIG. 8.

Figure 8A:
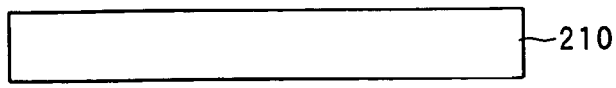
FIG. 8A–FIG. 8I are charts each showing a process step of a comparative example.
Figure 8B:
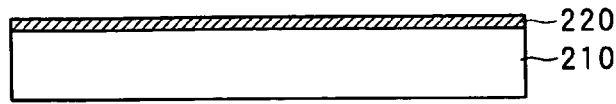
Figure 8C:
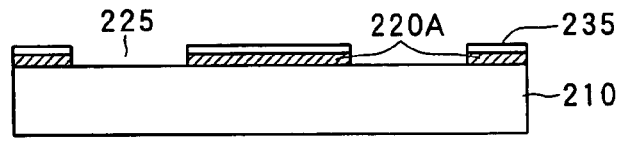

The process was advanced to FIG. 8C (equivalent to FIG. 2C) as is the case with Example 2.

Figure 8D:
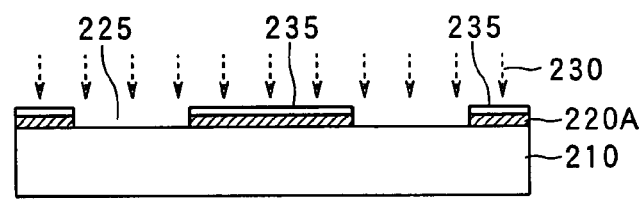
Figure 8E:
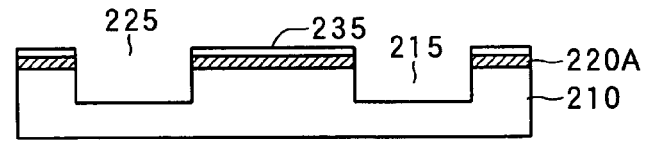

Next, a dry etching using $CF_4$ gas was carried out in order to form the shifter part, the substrate 210 was dug down so that the depth of dug-down part (recess) was stopped almost equal to [ë/2(n−1)]×(65/180), wherein ë is the wavelength of exposure light, and n is the refractive index of the substrate 210 (FIG. 8D, FIG. 8E).

Figure 8F:
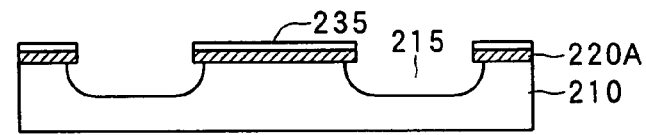

From this state, using hydrofluoric acid solution, further wet etching was carried out to obtain a depth of the dug-down part (recess) almost equal to ë/2 (n−1) (FIG. 8F).

Figure 8G:
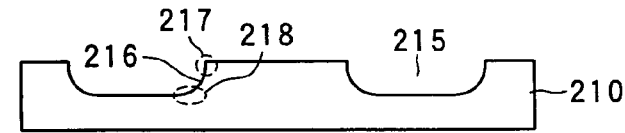

Subsequently, the above-mentioned resist film 235 was removed and the metal film 220 was exfoliated with predetermined liquid (FIG. 8G).

Figure 8H:
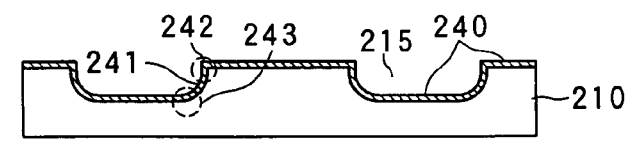
Figure 8I:
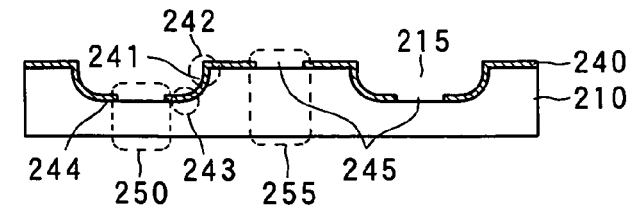

After carrying out washing treatment, as is the case with this example, sputtering formation of the shading film 240 which is comprised of chromium and chromium oxide was carried out all over the dug-down part 215 forming side of substrate 210 (FIG. 8H).

In this Comparative Example, since the top edge 217 of the dug-down part 215 of the substrate 210 was not round, the film formation of the shading film 240 was not uniformly performed at this portion.

Then, as is the case with this example, photoetching was performed. Etching of the shading film 240 was carried out in order to form the shifter part 250 and the non-shifter part 255 in predetermined shapes, and thereby, the one-side engraving type phase shift mask was manufactured.

In the case of the Comparative Example, since the top edge 217 of the dug-down part 215 of the substrate 210 was not round, film formation of the shading film 240 in this portion became uneven, and peeling occurred in washing processing.

Although it was confirmed that the shading film 240 may be uniformly formed if wet etching was further performed all over the dug-down part 215 forming side of the substrate 210 after the state of FIG. 8G, it becomes less realistic since to perform wet etching on the whole surface with such a structure could create severe problems in the process, such as alignment drawing accuracy.

Example 3

Figure 6A:
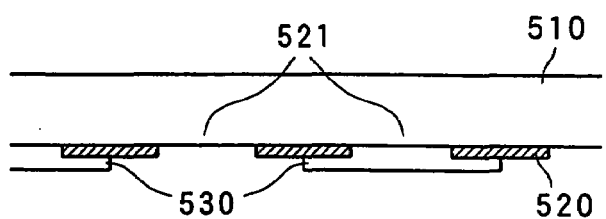
FIG. 6A–FIG. 6D are partial sectional views each showing an example of the conventional engraving type phase shift mask.
Figure 6B:
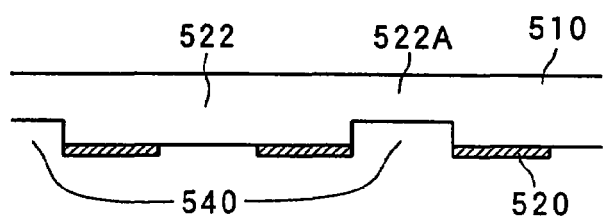
Figure 6C:
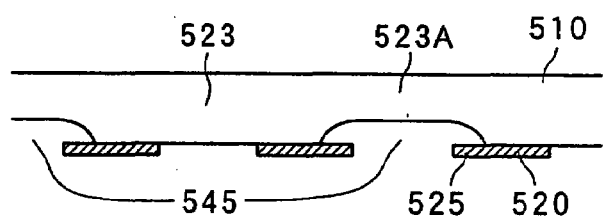
Figure 6D:
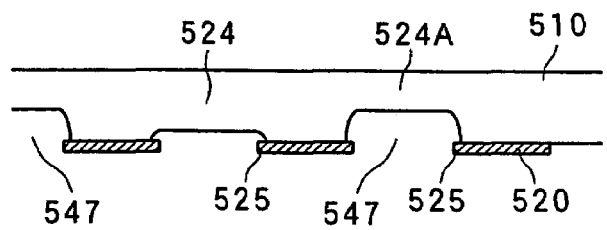

Example 3 is an example of a method of manufacturing a Levenson type phase shift mask for KrF which is shown in FIG. 2I and has a line pattern arrangement as shown in FIG. 6B, by using the manufacturing process to which the first mode of process shown in FIG. 3 was applied and which is almost similar to the process shown in FIG. 2.

First, on one side of the transparent substrate 210 (FIG. 2A), which is made of a synthetic quartz substrate (henceforth "Qz substrate") with a thickness of 6.3 mm, a photomask blank (FIG. 2B), made of the metal film 220 comprising chromium (110 nm in thickness) and chromium oxide (several nm in thickness) is layered. Then, onto the metal film 220, a resist IP3500 (commercialized by TOKYO OHKA KOGYO CO., LTD.) was coated to 4650 Å. Then, it was subjected to a proper exposure by photorepeater transfer equipment NSR-RE365 (commercialized by NIKON) in order to open the dug-down part forming area of the resist (corresponding to S330 of FIG. 3).

Incidentally, the photorepeater transfer equipment NSR-RE365 (commercialized by NIKON) uses an ultraviolet ray of 365 nm wavelength as the exposure light, and it has the capability of exposing a larger pattern than the exposure area thereof by connecting and exposing two or more master masks.

Subsequently, negatives were developed by the inorganic alkali developing solution. After forming the resist pattern which consists of a resist film 235 which has a predetermined opening on the metal film 220, dry etching of the metal film 220 which consists of chromium oxide and chromium and which was exposed from the opening of this resist film was carried out by using a chlorine-base gas in order to form a metal film pattern 220A.

Next, a dry etching using $CF_4$ gas was carried out in order to form the shifter part, the substrate 210 was dug down so that the depth of dug-down part (recess) was almost equal to ë/2 (n–1) (depth: 245 nm), wherein ë is the wavelength of the exposure light, and n is the refractive index of the substrate 210 (corresponding to FIG. 2D, FIG. 2E) The resist film 235 was removed, and the metal film pattern 220A was exfoliated (FIG. 2F), and 40 nm of wet etching was performed all over the substrate 210 using hydrofluoric acid solution.

Thereby, the upper edge 217a in the substrate dug-down part 215 were round (curvature radius of about 100 nm) (FIG. 2G).

Sputtering formation of the shading film 240, comprised of chromium (110 nm in thickness) and chromium oxide (several nm in thickness) and having a shading property to the exposure light, was carried out all over the dug-down part 215 forming side of substrate 210 (FIG. 2H).

Since the shading film 240 was formed in the state where the upper edge 217a in the substrate dug-down part 215 was round (FIG. 1G), the films were uniformly formed on the whole area, including the area around the upper edge 217a in the substrate dug-down part 215 as well as the other flat surface part of the substrate.

Then, on the shading film 240, resist ZEP (commercialized by Nippon Zeon Co., Ltd.) was applied, it was drawn with electronic beam drawing equipment HL800 (commercialized by Hitachi, Inc.), and negatives were developed by the inorganic alkali developing solution, thereby, the resist film (not shown) was formed at a predetermined form. Further, the shading film 240 which was exposed from the openings and which comprised the chromium oxide and chromium was dry etched by a chlorine-base gas. Thereafter, the resist film was exfoliated with a predetermined exfoliation liquid, washing treatment was carried out, and thereby, the one-side engraving type phase shift mask of this invention shown in FIG. 2I was produced.

This produced the phase shift mask shown in FIG. 5B and with an opening size of the shading film 680 of the line pattern (translucent part 650) in the dug-down part of 0.6 μm, and with an opening size of the shading film 680 of the line pattern (translucent part 660) of the not dug-down part (the recess depth is 0) of 0.6 μm, and the pitch of these openings set to 1.2 μm.

The projection exposure was carried out on the wafer using the obtained one-side engraving type phase shift mask. After development, the resist image of the line pattern (translucent part 650) in the mask dug-down part and the resist image of the line pattern (translucent part 660) in the part into which a digging of the mask was not put (recess depth=0) were formed with the same size.

As a result of measuring the optical intensity on a wafer using the simulator MSM100 commercialized by the Carl Zeiss Company, etc., it became as shown in FIG. 5A.

The optical intensity profile 690 on a wafer became as shown in FIG. 5A, and a difference was hardly seen between the optical intensities 650A and 660A on the wafer with respect to the adjacent line patterns corresponding to the respective line pattern parts (translucent parts) 650 and 660.

Example 4

As is the case with Example 3, Example 4 is an example of a method for manufacturing a Levenson type phase shift mask for KrF, as shown in FIG. 1I and has a line pattern arrangement as shown in FIG. 5B, by using the manufacturing process to which the second mode of process shown in FIG. 3 was applied and which is almost similar with the process shown in FIG. 1.

Now, referring to FIG. 1 and FIG. 3, this example will be illustrated.

First, onto one side of a transparent substrate 210 (FIG. 1A) made of a synthetic quartz substrate (henceforth "Qz substrate") with a thickness of 6.3 mm, a resist IP3500 (commercialized by TOKYO OHKA KOGYO CO., LTD.) was coated to 4650 Å. Then, as is the case with Example 3, it was subjected to a proper exposure by photorepeater transfer equipment NSR-RE365 (commercialized by NIKON) in order to open the dug-down part forming area of the resist (corresponding to S330 of FIG. 3).

Subsequently, negatives were developed by the inorganic alkali developing solution. After forming the resist pattern, which consists of a resist film 120 having a predetermined opening on the substrate 110, dry etching of the substrate exposed from the opening of this resist film was carried out by using $CF_4$ gas (FIG. 1C), in order to form dug-down part 115 (FIG. 1D).

The substrate 110 was dug down so that the depth of the dug-down part (recess) was almost equal to ë/2 (n−1) (depth: 245 nm), wherein ë is the wavelength of exposure light, and n is the refractive index of the substrate 110.

Since the decrease of the resist film 120 accompanied the etching of the substrate 110, the opening width pattern was spread at the same time, and finally, the etching was finished in the state where the side wall 116 of a dug-down part 115 was inclined so that it was spread toward the surface (é=20°) as shown in FIG. 1D.

Subsequently, after exfoliating the resist film 120 and carrying out washing treatment (FIG. 1E) all over the dug-down part 115 forming side of the substrate 110, a chromium film and a chromium oxide film were formed at 110 nm, and several nm (about 6–8 nm), respectively, by the sputtering method in order to form a shading film 150 (FIG. 1F).

The shading film 150 was uniformly formed on the whole area, including the side wall part 116 as well as the flat surface part of a substrate 110 and the bottom part of the dug-down part 115.

Then, on the shading film 150, resist ZEP (commercialized by Nippon Zeon Co., Ltd.) was applied, it was drawn with electron beam drawing equipment HL800 (commercialized by Hitachi, Inc.), negatives were developed by the inorganic alkali developing solution, and the resist film 160 was formed at predetermined form (FIG. 1G).

The shading film 150 which was exposed from the openings 165 of the resist film 160 and was comprised of chromium oxide and chromium was then dry etched by a mixed gas which includes chlorine as the main (FIG. 1H)

Thereafter, the resist film was exfoliated with a predetermined exfoliation liquid, washing treatment was carried out, and thereby, the one-side engraving type phase shift mask of this invention shown in FIG. 1I was produced.

This obtained the phase shift mask shown in FIG. 5B and where the opening size of the shading film 680 of the line pattern (translucent part) 650 in the dug-down part was made to be 0.6 µm, and the opening size of the shading film 680 of the line pattern (translucent part) 660 of the not dug-down part (the recess depth is 0) was made to be 0.6 µm, and the pitch of these openings was set to 1.2 µm.

The projection exposure was carried out on the wafer using the thus obtained one-side engraving type phase shift mask. After development, the resist image of the line pattern 660 (translucent part) in the mask dug-down part and the resist image of the line pattern 650 (translucent part) in the part in which there was no digging of a mask (recess depth=0) were formed with the same size.

As a result of measuring the optical intensity on a wafer using the simulator MSM100 commercialized by the Carl Zeiss Company, etc., it became as shown in FIG. 5A.

The optical intensity profile 690 on a wafer became as shown in FIG. 5A, and a difference was hardly seen between the optical intensities 650A and 660A on the wafer with respect to the adjacent line patterns corresponding to the respective line pattern parts (translucent parts) 650 and 660.

The invention claimed is:

1. A method for manufacturing a single sided engraving phase shift mask having a shifter part and a non-shifter part mutually adjacent on a transparent substrate, and a patternized shading film covering continuously from the end of said shifter part to the adjacent end of said non-shifter part including a sidewall of a dug-down part forming said shifter part, and having openings at the shifter part and the non-shifter part, the sidewall of the dug-down part having round, crooked portions at top and bottom corners of the sidewall of the dug-down part, wherein the method is comprised of the following steps in this order:
    (a) a step for forming a metal film on the substrate and then forming a resist film on the metal film, and subsequently forming a resist pattern in the resist film and the metal film selectively having an opening at the shifter part,
    (b) a step for forming the dug-down part corresponding to the shifter part by using the resist pattern, including the metal film pattern, from step (a) as an etching-proof mask to dry etch the substrate, using a dry etching agent, to a prescribed depth,
    (c) a step for, after removing the resist film and metal film, wet etching the whole surface at the dug-down part forming side of the substrate, using a wet etching agent, to form a round crooked shape at the top and bottom corners of the sidewall of the dug-down part,
    (d) a step for forming a shading film which continuously covers the whole top surface of the substrate, including the dug-down part sidewall and the bottom part thereof and the non-dug-down part of the substrate,
    (e) a step for the formation of a resist pattern on the shading film formed in step (d) having prescribed openings at the shifter part and the non-shifter part, and
    (f) a step for forming a shading pattern having prescribed openings at the shifter part and the non-shifter part by first using the resist pattern from step (e) as an etching-proof mask to photo-etch the shading film from step (d) and then subsequently removing the resist pattern film.

2. The method according to claim 1, wherein the depth (d) of the substrate dug-down by the dry etching in step (b) substantially satisfies the following condition: d=ë/2(n−1), where ë is the wavelength of the exposure light to be used and n is the refractive index of the substrate, and the depth of the substrate etched by the wet etching in step (c) is between 10 nm and 100 nm.

3. The method according to claim 1, wherein a photorepeater is used in step (a) for forming the resist pattern having a selective opening at the shifter part.

4. A method for manufacturing a single sided engraving phase shift mask having a shifter part and a non-shifter part mutually adjacent on a transparent substrate, and a patternized shading film covering continuously from the end of said shifter part to the adjacent end of said non-shifter part including a sidewall of a dug-down part forming said shifter part, and having openings at the shifter part and the non-shifter part, and further, the sidewall inclining upward and having round, crooked portions at top and bottom corners of the sidewall of the dug-down part, wherein the method is comprised of the following steps in this order:
    (a) a step for using a dry etching method and a resist material to form, directly on the substrate, a resist pattern having a selective opening at the shifter part;
    (b) a step for forming a dug-down part corresponding to the shifter part by using the resist pattern formed in step (a) as an etching-proof mask to dry etch the substrate to a prescribed depth;
    (c) a step for etching the whole surface of the dug-down part forming side of the substrate by wet etching after removing the resist pattern film, to form a round, crooked shape at the top and bottom corners of the sidewall of the dug-down part;
    (d) a step for forming a shading film which continuously covers the whole top surface of the substrate, including the dug-down part sidewall and the bottom part thereof and the non-dug-down part of the substrate;

(e) a step for forming a resist pattern on the shading film from step (d) having prescribed openings at the shifter part and the non-shifter part;

(f) a step for forming a shading pattern having prescribed openings at the shifter part and the non-shifter part by first using the resist pattern from step (e) as an etching-proof mask to photo-etch the shading film from step (d) and then subsequently removing the resist pattern film.

5. The method according to claim 4, wherein the depth (d) of the substrate dug-down by the dry etching in step (b) substantially satisfies the following condition: $d=ë/2(n-1)$, where ë is the wavelength of the exposure light to be used and n is the refractive index of the substrate, and the depth of the substrate etched by the wet etching in step (c) is between 10 nm and 100 nm.

6. The method according to claim 4, wherein a photorepeater is used in step (a) for forming the resist pattern having a selective opening at the shifter part.

* * * * *